US010689776B2

(12) United States Patent
Yang et al.

(10) Patent No.: US 10,689,776 B2
(45) Date of Patent: Jun. 23, 2020

(54) PREPARATION METHOD OF MONOCRYSTAL URANIUM DIOXIDE NUCLEAR FUEL PELLETS

(71) Applicant: Institute of Materials, China Academy of Engineering Physics, Jiangyou (CN)

(72) Inventors: Zhenliang Yang, Jiangyou (CN); Bingqing Li, Jiangyou (CN); Rui Gao, Jiangyou (CN); Pengcheng Zhang, Shenzhen (CN); Jianping Jia, Jiangyou (CN); Hao Tang, Jiangyou (CN); Limei Duan, Jiangyou (CN); Xuxu Liu, Jiangyou (CN); Yi Zhong, Jiangyou (CN); Qiqi Huang, Jiangyou (CN); Zhiyi Wang, Jiangyou (CN); Tong Liu, Shenzhen (CN); Hailong Wu, Shenzhen (CN); Siyu Gao, Shenzhen (CN); Maozhou Sun, Shenzhen (CN)

(73) Assignees: Institute of Materials, China Academy of Engineering Physics, Jiangyou (CN); China Nuclear Power Technology Research Institute Co. Ltd., Shenzhen (CN)

( * ) Notice: Subject to any disclaimer, the term of this patent is extended or adjusted under 35 U.S.C. 154(b) by 226 days.

(21) Appl. No.: 15/924,191

(22) Filed: Mar. 17, 2018

(65) Prior Publication Data
US 2019/0127876 A1 May 2, 2019

(30) Foreign Application Priority Data

Oct. 27, 2017 (CN) .......................... 2017 1 1020027

(51) Int. Cl.
*C30B 9/08* (2006.01)
*G21C 3/62* (2006.01)
(Continued)

(52) U.S. Cl.
CPC .............. *C30B 9/08* (2013.01); *C01G 43/025* (2013.01); *C04B 35/51* (2013.01);
(Continued)

(58) Field of Classification Search
CPC ........ Y02E 30/38; G21C 3/623; G21C 3/045; G21C 3/626; C01G 43/025; C30B 29/16; C30B 25/00; C30B 11/00; C30B 35/007
See application file for complete search history.

(56) References Cited

U.S. PATENT DOCUMENTS 5,180,527 A * 1/1993 Hirai .................. G21C 3/62
 252/638
5,211,905 A * 5/1993 Wood .................. C01G 43/025
 376/261

(Continued)

FOREIGN PATENT DOCUMENTS

CN 107256726 A * 10/2017 ............... G21C 3/64

OTHER PUBLICATIONS

English Computer translation of CN107256726 (Year: 2020).*

*Primary Examiner* — Matthew J Song
(74) *Attorney, Agent, or Firm* — Erson IP (Nelson IP)

(57) ABSTRACT

The application discloses a preparation method of monocrystal uranium dioxide nuclear fuel pellets, comprising: granulating and pelleting $UO_2$ powder to obtain $UO_2$ pellets; then coating surfaces of the $UO_2$ pellets with monocrystal growth additive micro powder to form core-shell structure particles; and activated-sintering the core-shell structure particles at high temperature, liquefying the monocrystal growth additive on the surface of the core-shell structure particle at high temperature and then diffusing into $UO_2$ pellets, dissolving the $UO_3$ in the liquid monocrystal growth additive, and recrystallizing the $UO_2$ to form the monocrystal $UO_2$ nuclear fuel pellets.

10 Claims, 3 Drawing Sheets

(51) Int. Cl.
*C30B 35/00* (2006.01)
*C01G 43/025* (2006.01)
*C30B 29/16* (2006.01)
*G21C 21/00* (2006.01)
*G21C 21/02* (2006.01)
*C04B 35/626* (2006.01)
*C04B 35/628* (2006.01)
*C04B 35/51* (2006.01)
*G21C 3/04* (2006.01)
*C30B 25/00* (2006.01)

(52) U.S. Cl.
CPC .... *C04B 35/6262* (2013.01); *C04B 35/62695* (2013.01); *C04B 35/62807* (2013.01); *C04B 35/62813* (2013.01); *C04B 35/62818* (2013.01); *C30B 25/00* (2013.01); *C30B 29/16* (2013.01); *C30B 35/007* (2013.01); *G21C 3/045* (2019.01); *G21C 3/623* (2013.01); *G21C 3/626* (2013.01); *G21C 21/00* (2013.01); *G21C 21/02* (2013.01); *C01P 2004/60* (2013.01); *C01P 2004/61* (2013.01); *C04B 2235/528* (2013.01); *C04B 2235/5427* (2013.01); *C04B 2235/5436* (2013.01); *C04B 2235/666* (2013.01); *C04B 2235/77* (2013.01); *Y02E 30/38* (2013.01)

(56) References Cited

U.S. PATENT DOCUMENTS

| | | | |
|---|---|---|---|
| 2015/0221398 A1* | 8/2015 | Subhash | G21C 21/02 376/409 |
| 2016/0232993 A1* | 8/2016 | Kurina | G21C 3/58 |
| 2017/0249998 A1* | 8/2017 | Choi | G21C 3/623 |

* cited by examiner (8-411)[-81712]

(-13-4-1)[2-72]

(-416-13)[-5-11-12]

PREPARATION METHOD OF MONOCRYSTAL URANIUM DIOXIDE NUCLEAR FUEL PELLETS

CROSS-REFERENCE TO RELATED APPLICATIONS

This application claims priority to Chinese Patent Application No. 201711020027.7 with a filing date of Oct. 27, 2017. The content of the aforementioned applications, including any intervening amendments thereto, are incorporated herein by reference.

TECHNICAL FIELD

The present invention relates to a preparation method of monocrystal uranium dioxide nuclear fuel pellets.

BACKGROUND OF THE PRESENT INVENTION

Uranium dioxide (UO2) is the most commonly used nuclear fuel in commercial nuclear reactors, and has the advantages of high melting point, good high temperature stability, good chemical compatibility with cladding materials and coolant, strong anti-radiation capability, low thermal neutron capture section as anon-fission combined element oxygen and the like. However, there is still a significant problem with the UO2, that is, the heat conductivity is low. The heat conductivity is only 2.8 W/m·k at 1000° C., resulting in a large temperature gradient in the UO2 fuel pellets under working conditions, thereby producing high center temperature and severe thermal stress that will lead to large-scale cracks of the fuel pellets. The cracks may significantly increase the release of fission gases under a high burn-up condition, while the increase of operation temperature of the reactors may further accelerate the release of the fission gases and form bubbles, thereby leading to the swelling of the fuel pellets. Therefore, the service life of the UO2 fuel in the reactors is obviously limited.

Furthermore, high center temperature and large temperature gradient of the fuel pellets may lead to a great amount of waste heat, which will apparently increase the cladding temperature in a failure accident of the coolant. For example, for a uranium dioxide fuel pellet of a zirconium alloy cladding, since a reaction rate of the zirconium alloy cladding and water may be greatly increased at a temperature of 1200° C. or higher, a great amount of ZrO2 may be generated on the surface, thereby reducing the heat transferring capability of the cladding, finally leading to the crack of a zirconium alloy cladding layer and resulting in safety potential danger (R. O. Meyer. Nucl. Technol., 2006. 155: 293). Therefore, in order to improve the safety of the nuclear reactor and the burn-up of the nuclear fuel and reduce the nuclear power cost, on the premise of not influencing characteristics of UO2 neutrons, it is of crucial importance to improve the heat conductivity of the UO2 nuclear fuel and the retention capability of a fission product in a radiation environment.

Research shows that a barrier of a crystal boundary is a key factor limiting the heat conductivity of UO2; the existence of the crystal boundary may lead to the decrease of the heat conductivity to a great extent; and at different temperatures, the heat conductivity of the UO2 is on a rising trend along with the increase of the crystal grain size (Nature Communications, 2014, 5: 1-7). Therefore, the preparation of the UO2 with large crystal grain size becomes an important means to improve the heat conductivity of the UO2 nuclear fuel.

SUMMARY OF PRESENT INVENTION purpose of the present invention is to provide a preparation method of monocrystal uranium dioxide nuclear fuel pellets. The method can prepare large-grain monocrystal UO2 nuclear fuel pellets, can apparently improve the high-temperature radiation stability and heat conductivity performance of the fuel pellets, the retention capability of fission products the internal pressure of fuel rods, the capability of reducing the interaction between the fuel pellet and a cladding and a burn-up depth, can improve the operation safety of a reactor, and can increase the economic benefit of a nuclear power plant.

In order to achieve the above-mentioned purpose, the present invention adopts a technical solution as follows:

A preparation method of monocrystal uranium dioxide nuclear fuel pellets comprises: granulating and pelleting UO2 powder to obtain UO2 pellets; then coating the surfaces of the UO2 pellets with monocrystal growth additive micro powder to form core-shell structure particles; and activated-sintering the core-shell structure particles at a high temperature, liquefying monocrystal growth additives on the surfaces of the core-shell structure particles at a high temperature and then diffusing into the UO2 pellets, dissolving the UO2 in the liquid monocrystal growth additives, and recrystallizing the UO2 to form the monocrystal UO2 nuclear fuel pellets.

Specifically, the monocrystal growth additive micro powder is any one of the follow four types of micro powder: Cr micro powder, $Cr_2O_3$ micro powder, mixed micro powder of $Al_2O_3$ and $SiO_2$, and mixed powder of $Al_2O_3$ and $Y_2O_3$.

Further, the preparation method specifically comprises the following steps:

(1) pre-sintering the UO2 powder by adopting a discharge plasma sintering technique or cold-pressing forming the UO2 powder by adopting a powder metallurgy mold to obtain a UO2 pre-formed blank with the density of 5.0 to 6.5 g/cm3;

(2) breaking and sieving the pre-formed blank to obtain UO2 particles with a particle size of 15 to 100 meshes; then grinding and pelleting the UO2 particles for 2 to 12 hours to obtain UO2 pellets;

(3) loading the UO2 pellets into a mixing and cladding device, adding 0.06 to 0.5 wt. % of binder and 5 to 30 vol. % of monocrystal growth additive, and mixing and cladding for 0.5 to 8 hours to obtain core-shell structure particles with the monocrystal growth additive uniformly covering the surface of the UO2 pellet; and (4) pressing the core-shell structure particles into UO2-based nuclear fuel pellet biscuits, activated-sintering the UO2-based nuclear fuel pellet biscuits at a high temperature in a micro-oxidation atmosphere, and cooling to obtain the monocrystal UO2 nuclear fuel pellets, wherein the sintering temperature is 1600 to 1900° C., and the heat preserving time is 1 to 8 hours.

Preferably, in the step (1), the particle size of the UO2 powder is 50 nm to 200 μm.

Preferably, in the step (3), the particle size of the monocrystal growth additive is 20 nm to 100 μm.

Further, in the step (4), the density of the UO2-based nuclear fuel pellet biscuit is 5.6 to 6.8 g/cm3.

Further, in the step (4), the micro-oxidation atmosphere is a mixed gas atmosphere of hydrogen and carbon dioxide or a mixed gas atmosphere of hydrogen and steam.

When the monocrystal growth additive micro powder is the mixed micro powder of $Al_2O_3$ and $SiO_2$, a mass ratio of $Al_2O_3$ to $SiO_2$ is 1:1; and when the monocrystal growth additive micro powder is the mixed micro powder of $Al_2O_3$ and $Y_2O_3$, the mass ratio of $Al_2O_3$ to $Y_2O_3$ is 1:1.

The principle of the present invention is as follows: the core-shell structure particles of the $UO_2$-monocrystal growth additive is formed and sintered at a high temperature; the monocrystal growth additive powder covering the surface of the $UO_2$ particles is locally liquefied; one part of the monocrystal growth additive is diffused into the $UO_2$ particles to recrystallize the $UO_2$ particles, and finally the large-grained monocrystals are formed; and the other part, of liquid monocrystal growth additive is interconnected to form a micro-cell similar to the structure of cytomembrane around the $UO_2$ particles. The structural characteristic can reduce the interface heat resistance for the internal heat conduction of the pellets to a certain extent, thereby improving the heat conductivity of the fuel pellets.

Compared with the prior art, the present invention has the following beneficial effects:

(1) The present invention firstly adopts Cr, $Cr_2O_3$, $Al_2O_3\backslash SiO_2$, $Al_2O_3\backslash Y_2O_3$ and the like as a $UO_2$ monocrystal growth additive, and activates and sinters the $UO_2$ fuel pellets with the above monocrystal growth additive at high temperature in the micro-oxidation atmosphere; and the crystal growth additive gradually becomes liquid at high temperature and is mutually diffused with the $UO_2$ matrix, thereby promoting the recrystallization and growth of $UO_2$; on one hand, the micro-oxidation atmosphere can accelerate the liquefying of the crystal growth additive, and on the other hand, can also facilitate the mutual diffusion between the crystal growth additive and the $UO_2$; rapid growth of the $UO_2$ crystal grains at a relatively low temperature and in a relatively short time can be realized by virtue of the synergistic effect of the crystal grain growth additive and the $UO_2$; and the monocrystal $UO_2$ fuel pellet with large crystal grain size can be obtained, so that the process is simple, the preparation period is short, and the batch preparation can be realized.

(2) By adopting the SPS low-temperature pre-sintering process, low-density and high-strength $UO_2$ pre-sintered blanks can be obtained; the $UO_2$ pellets with good sphericity, low density and high strength can be obtained by virtue of breaking, sieving and pelleting; and the characteristic can facilitate the cladding of the monocrystal growth additive powder on the surfaces of the $UO_2$ pellets, and the monocrystal growth additive-cladded uranium dioxide core-shell, structure particles with good cladding effect can be obtained, so that the monocrystal $UO_2$ fuel pellets with a uniform tissue structure can be more easily obtained.

(3) By increasing the size of the $UO_2$ crystal grains and reducing the crystal boundary, on one hand, the heat conductivity and the anti-radiation performance of the fuel pellet are improved, and on the other hand, the release amount of fission products is reduced thereby improving the safety of the reactor and the fuel system.

(4) The high-temperature radiation stability and heat conductivity performance of the monocrystal uranium dioxide fuel pellets prepared by the method of the present invention, the retention capability of fission products, the internal pressure of fuel rods, the capability of reducing the interaction between the fuel pellet and a cladding and the burn-up depth can be apparently improved; the operation safety of the reactor can be improved; and the economic benefit of a nuclear power plant is increased.

DETAILED DESCRIPTION OF PREFERRED EMBODIMENTS

The present invention is further described below in combination with drawings and embodiments. The present invention includes but not limited to the following embodiments.

A purpose of the present embodiment is to provide a preparation method of monocrystal uranium dioxide nuclear fuel pellets so as to prepare the nuclear fuel pellets with high heat conductivity and anti-radiation performance, The principle of the preparation method is as follows: the monocrystal growth additive such as Cr, $Cr_2O_3$, $Al_2O_3\backslash SiO_2$, $Al_2O_3\backslash Y_2O_3$ and the like are mixed with $UO_2$ particles and molded; the monocrystal growth additive micro powder covers the surface of the $UO_2$ pellets to form the core-shell structure particles; then the core-shell structure particles are sintered at the high temperature in a reactive atmosphere; the monocrystal growth additive is liquefied and mutually diffused with the $UO_2$; and the monocrystal $UO_2$ fuel pellets are finally obtained. The preparation method can increase the size of the $UO_2$ crystal grains and reduce the crystal boundaries, thereby improving the heat conductivity and the anti-radiation performance of the $UO_2$ fuel pellets, and improving the safety of the reactor and the fuel system.

Figure 1:
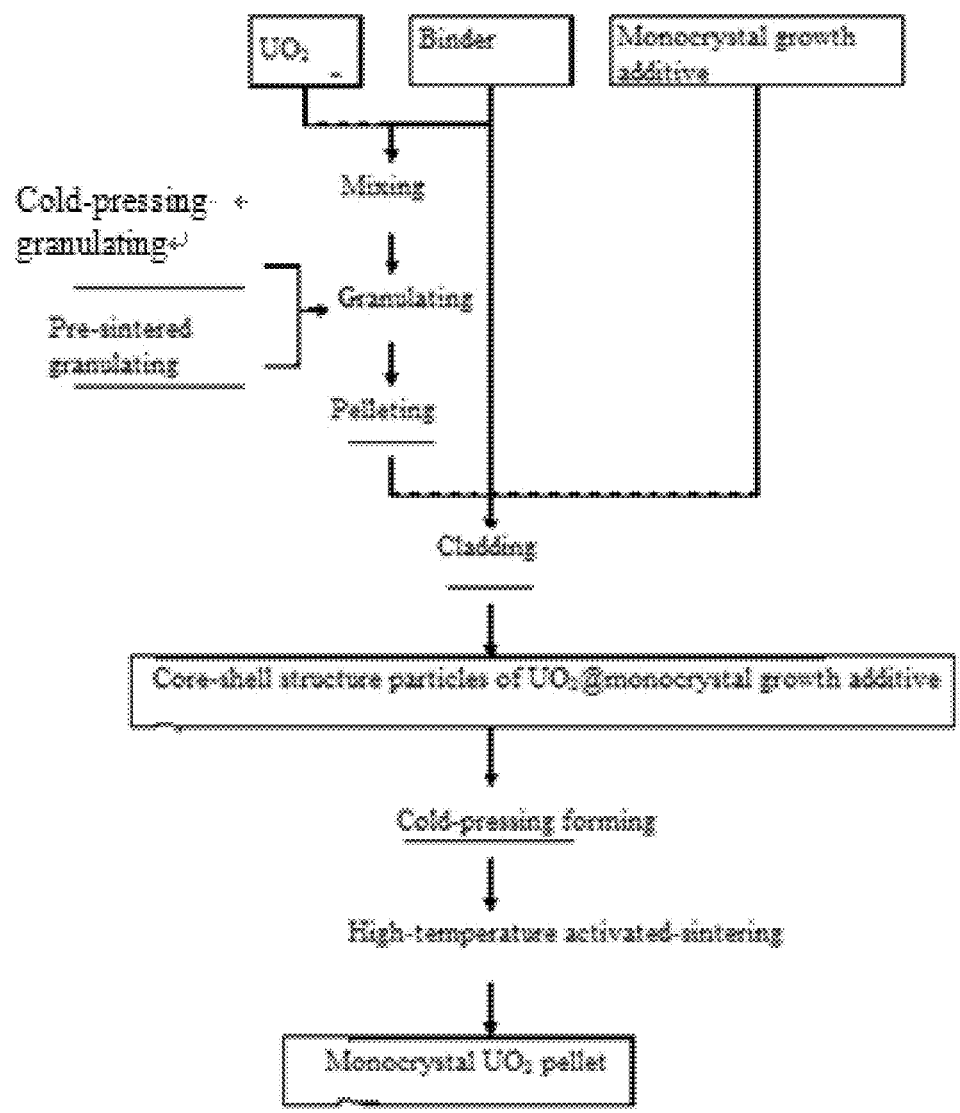
FIG. 1 is a flow block diagram of the present invention.

Specifically, as shown in FIG. 1, the preparation method comprises the following steps:

(1) uniformly mixing the $UO_2$ powder with the particle size of 50 nm to 200 μm, loading the powder into a special low-temperature pre-sintering graphite mold of spark plasma sintering (SPS), and then placing in a SPS furnace for rapidly pre-sintering the powder at a low temperature to obtain a $UO_2$ preformed blank with a density of 5.0 to 6.5 g/cm3; or uniformly mixing the $UO_2$ powder with a particle size of 50 nm to 200 μm, and loading the powder into a powder metallurgy preforming mold for biaxially pressing and forming the powder to obtain the $UO_2$ preformed blank with a density of 5.0 to 6.5 g/cm3;

(2) breaking and sieving the pre-formed blank, granulating to obtain the $UO_2$ particles with a particle size of 15 to 100 meshes; and then grinding and pelleting the $UO_2$ particles for 2 to 12 hours in a pelleting device to obtain $UO_2$ pellets with good sphericity;

(3) loading the $UO_2$ pellets into a mixing and cladding device, adding 0.05 to 0.5 wt. % of binder and 5 to 30 vol. % of monocrystal growth additive with a particle size of 200 nm to 100 μm, and mixing and cladding for 0.5 to 8 hours to obtain core-shell structure particles with $UO_2$@ monocrystal growth additive, wherein the binder is at least one of zinc stearate and Acrawax (AKL), and the monocrystal growth additive micro powder is any one of the follow four types of micro powder: Cr micro powder, $Cr_2O_3$ micro powder, mixed micro powder of $Al_2O_3$ and $SiO_2$, and mixed powder of $Al_2O_3$ and Y2O3. Moreover, when the monocrystal growth additive micro powder is the mixed micro powder of Al2O3 and SiO2, a mass ratio of Al2O3 to SiO2 is 1:1; and when the monocrystal growth additive micro powder is the mixed micro powder of Al2O3 and Y2O3, the mass ratio of Al2O3 to Y2O3 is 1:1;

(4) loading the core-shell structure particles (UO2@Cr, UO2@Cr2O3, UO2@Al2O3\SiO2 or UO2@A12O3\Y2O3) into a powder metallurgy forming mold for cold-pressing forming the core-shell structure particles to obtain the UO2-based nuclear fuel pellet biscuits with a density of 5.6 to 6.8 g/cm3; and (5) loading the UO2-based nuclear fuel pellet biscuits into an atmosphere sintering furnace, performing the high-temperature activated sintering in a mixed gas atmosphere of the hydrogen and carbon dioxide or a mixed gas atmosphere of the hydrogen and steam, and cooling to obtain the monocrystal UO2 pellets, wherein the sintering temperature is 1600 to 1900 and the heat preserving time is 1 to 8 hours.

The present embodiment is described in detail below with embodiment 1 to embodiment 6.

Embodiment 1

Preparation of the monocrystal UO2-CR2O3 nuclear fuel pellets: the UO2 powder with the particle size of 10 μm is loaded into a special low-temperature pre-sintering graphite mold of SPS and then placed in an SPS furnace and rapidly pre-sintered at a low temperature to obtain the UO2 preformed blank with the density of 6.5 g/cm3; the preformed blank is broken and sieved to obtain the UO2 particles with the particle size of 50 meshes; then the UO2 particles are loaded into a pelleting device and ground and pelleted for 12 hours to obtain the UO2 pellets with good sphericity; the UO2 pellets are loaded into the mixing and cladding device, and 0.1 wt. % of Acrawax and 10 vol. % of monocrystal growth additive Cr2O3 with the particle size of 20 nm are added to perform mixing and cladding for 8 hours, thereby obtaining the UO2@Cr2O3 core-shell structure particles with the monocrystal growth additive uniformly covering the surfaces of the UO2 pellets.

The UO2@Cr2O3 core-shell structure particles are loaded into the powder metallurgy forming mold, and pressed into the UO2-based nuclear fuel pellet biscuits with the density of 6.8 g/cm3; the UO2-based nuclear fuel pellet biscuits, are loaded into an atmosphere sintering furnace and are activated-sintered at high temperature in a micro-oxidation atmosphere of hydrogen and carbon dioxide, wherein the sintering temperature is 1750° C. and the heat preserving time is 4 hours; and cooling is performed to obtain the monocrystal UO2 nuclear fuel pellets.

Embodiment 2

The UO2 powder with the particle size of 200 μm is loaded into a powder metallurgy preforming mold and biaxially pressed and formed to obtain the UO2 preformed blank with the density of 5.5 g/cm3; the preformed blank is broken and sieved to obtain UO2 particles with the particle size of 30 meshes; then the UO2 particles are, loaded into a pelleting device and ground and pelleted for 4 hours to obtain UO2 pellets with good sphericity; then the UO2 pellets are loaded into a mixing and cladding device, and 0.5 wt. % of Acrawax and 30 vol. % of monocrystal growth additive Cr with the particle size of 100 μm are added to perform mixing and cladding for 1 hour, thereby obtaining the core-shell structure particles UO2@Cr with the monocrystal growth additive uniformly covering the surfaces of the UO2 pellets.

The UO2@Cr core-shell structure particles are loaded into the powder metallurgy forming mold and pressed into the UO2-based nuclear fuel pellet biscuits with the density of 6.0 g/cm3; and the UO2-based nuclear fuel pellet biscuits are loaded into the atmosphere sintering furnace and activated-sintered at a high temperature in a micro-oxidation atmosphere of hydrogen and steam, wherein the sintering temperature is 1700° C., the heat preserving time is 1 hour; and cooling is performed to obtain the monocrystal UO2 nuclear fuel pellets.

Embodiment 3

The UO2 powder with the particle size of 100 μm is loaded into a special low-temperature pre-sintering graphite mold of SPS and then placed in an SPS furnace and rapidly pre-sintered at a low temperature to obtain the UO2 preformed blank with the density of 6.0 g/cm3; the preformed blank is broken and sieved to obtain the UO2 particles with the particle size of 100 meshes; then the UO2 particles are loaded into a pelleting device and ground and pelleted for 8 hours to obtain the UO2 pellets with good sphericity; the UO2 pellets are loaded into the mixing and cladding device, and 0.05 wt. % of zinc stearate and 20 vol. % of monocrystal growth additive Al2O3\SiO2 with the particle size of 100 nm are added, wherein the mass ratio of Al2O3 to SiO2 is 1:1; mixing and cladding are performed for 6 hours, thereby obtaining the UO2@Al2O3\SiO2 core-shell structure particles with the monocrystal growth additive uniformly covering the surfaces of the UO2 pellets.

The UO2@Al2O3\SiO2 core-shell structure particles are loaded into the powder metallurgy forming mold, and pressed into the UO2-based nuclear fuel pellet biscuits with the density of 6.5 g/cm3; the UO2-based nuclear fuel pellet biscuits are loaded into an atmosphere sintering furnace and are activated-sintered at a high temperature in a micro-oxidation atmosphere of hydrogen and carbon dioxide, wherein the sintering temperature is 1600° C. and the heat preserving time is 5 hours; and cooling is performed to obtain the monocrystal UO2 nuclear fuel pellets.

Embodiment 4

The UO2 powder with the particle size of 50 nm is loaded into a powder metallurgy preforming mold and biaxially pressed and formed to obtain the UO2 preformed blank with the density of 5.0 g/cm3; the preformed blank is broken and sieved to obtain UO2 particles with the particle size of 15 meshes; then the UO2 particles are loaded into a pelleting device and ground and pelleted for 2 hours to obtain UO2 pellets with good sphericity; then the UO2 pellets are loaded into a mixing and cladding device, and 0.1 wt. % of zinc stearate and 15 vol. % of monocrystal growth additive Cr with the particle size of 5 μm are added to perform mixing and cladding for 0.5 hour, thereby obtaining the core-shell structure particles UO2@Cr with the monocrystal growth additive uniformly covering the surfaces of the UO2 pellets.

The UO2@Cr core-shell structure particles are loaded into the powder metallurgy forming mold and pressed into the UO2-based nuclear fuel pellet biscuits with the density of 5.6 g/cm3; and the UO2-based nuclear fuel pellet biscuits are loaded into the atmosphere sintering furnace and activated-sintered at a high temperature in a micro-oxidation atmosphere of hydrogen and steam, wherein the sintering temperature is 1700° C. the heat preserving time is 4 hours; and cooling is performed to obtain the monocrystal UO2 nuclear fuel pellets.

Embodiment 5

The UO2 powder with the particle size of 200 nm is loaded into a powder metallurgy preforming mold and biaxially pressed and formed to obtain the UO2 preformed blank with the density of 5.8 g/cm3; the preformed blank is broken and sieved to obtain UO2 particles with the particle size of 30 meshes; then the UO2 particles are loaded into a pelleting device and ground and pelleted for 4 hours to obtain UO2 pellets with good sphericity; then the UO2 pellets are loaded into a mixing and cladding device, and 0.05 wt. % of Acrawax and 5 vol. % of monocrystal growth additive Cr2O3 with the particle size of 50 are added to perform mixing and cladding for 1 hour, thereby obtaining the core-shell structure particles UO2@Cr2O3 with the monocrystal growth additive uniformly covering the surfaces of the UO2 pellets.

The UO2@Cr2O3 core-shell structure, particles are loaded into the powder metallurgy forming mold and pressed into the UO2-based nuclear fuel pellet biscuits with the density of 6.2 g/cm3; and the UO2-based nuclear fuel pellet biscuits are loaded into the atmosphere sintering furnace and activated-sintered at a high temperature in a micro-oxidation atmosphere of hydrogen and carbon dioxide, wherein the sintering temperature is 1700° C., the heat preserving time is 8 hours; and cooling is performed to obtain the monocrystal UO2 nuclear fuel pellets.

Embodiment 6

The UO2 powder with the particle size of 50 μm is loaded into a special low-temperature pre-sintering graphite mold of SPS and then placed in an SPS furnace and rapidly pre-sintered at a low temperature to obtain the UO2 preformed blank with the density of 5.5 g/cm3; the preformed blank is broken and sieved to obtain the UO2 particles with the particle size of 25 meshes; then the UO2 particles are loaded into a pelleting device and ground and pelleted for 3 hours to obtain the UO2 pellets with good sphericity; the UO2 pellets are loaded into the mixing and cladding device, and 0.5 wt. % of zinc stearate and 20 vol. % of monocrystal growth additive Al2O3\Y2O3 with the particle size of 200 nm are added to perform mixing and cladding for 1 hour, thereby obtaining the UO2@Al2O3\Y2O3 core-shell structure particles with the monocrystal growth additive uniformly covering the surfaces of the UO2 pellets.

The UO2@Al2O3\Y2O3 core-shell structure particles are loaded into the powder metallurgy forming mold, and pressed into the UO2-based nuclear fuel pellet biscuits with the density of 6.0 g/cm3; the UO2-based nuclear fuel pellet biscuits are loaded into an atmosphere sintering furnace and are activated-sintered at a high temperature in a micro-oxidation atmosphere of hydrogen and carbon dioxide, wherein the sintering temperature is 1900° C. and the heat preserving time is 1 hour; and cooling is performed to obtain the monocrystal UO2 nuclear fuel pellets.

Figure 2:
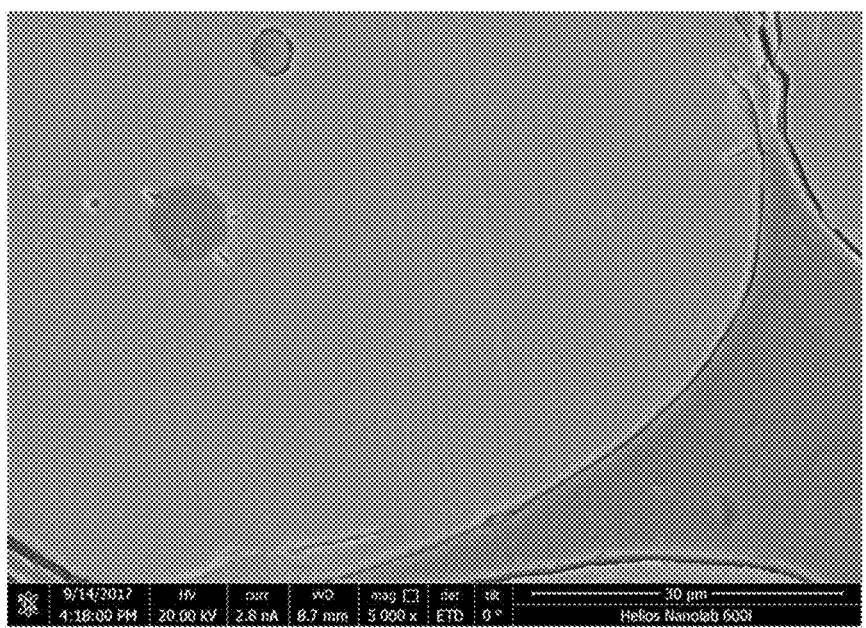
FIG. 2 is a scanning electron microscope topography of monocrystal uranium dioxide fuel pellets of embodiment 6.
Figure 3:
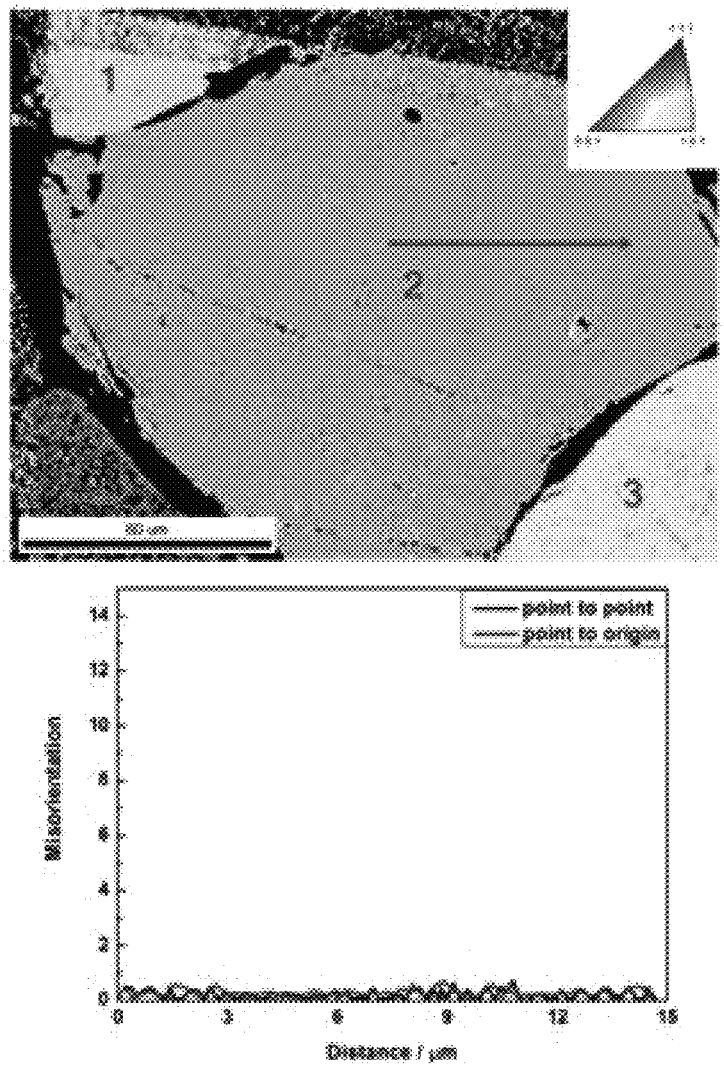
FIG. 3 is an electron back scattering diffraction diagram of monocrystal uranium dioxide fuel pellets of embodiment 6.
Figure 3:
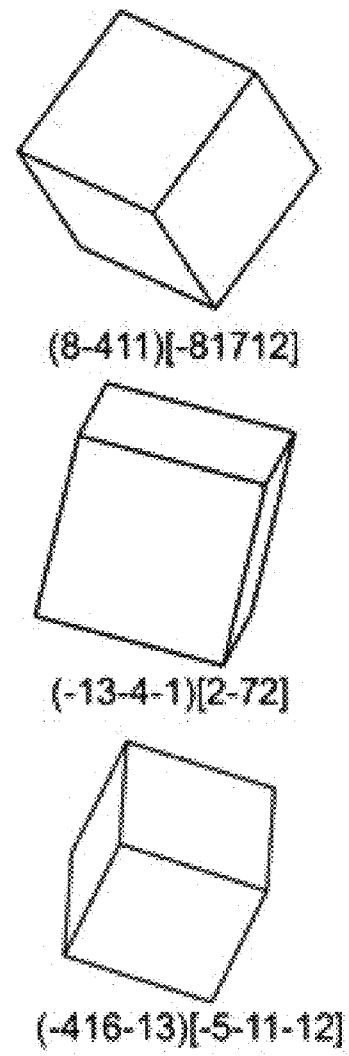

The obtained monocrystal UO2 nuclear fuel pellets are subjected to electron microscope scanning to obtain an electron microscope scanning photo as shown in FIG. 2. It can be seen from FIG. 2 that in the nuclear fuel pellets of the present embodiment, one part of the monocrystal growth additive powder cladding the, surfaces of the UO2 particles is diffused into the UO2 particles, and the UO2 is recrystallized to form large-grain monocrystal; and the other part of the monocrystal growth additive powder is interconnected to form micro-cells similar to the structure of the cytomembrane around the UO2 particles. Further, the present embodiment also obtains an electron back scattering diffraction pattern of uranium dioxide monocrystals as shown in FIG. 3. It can be seen from FIG. 3 that the crystal plane of each UO2 particle is consistent in orientation, which shows that all UO2 particles in the fuel pellets are monocrystals. Thus, it can be seen that the large-grain monocrytsal uranium dioxide pellets are successfully prepared by adding the monocrystal growth additive and using the sintering in the micro-oxidation atmosphere; and by increasing the size of the UO2 crystal grains and reducing the crystal boundary, the heat conductivity and anti-radiation performance of the UO2 fuel pellets are improved, thereby improving the safety of the reactor and the fuel system.

The above embodiments are only one of preferred embodiments of the present invention and should not be used to limit the protection scope of the present invention, but any modification or polishing without any substantial meaning made within the thought and the spirit of the present invention (the technical problems solved thereby are still consistent with those in the present invention) should be included within the scope of the present invention.

We claim:

1. A preparation method of monocrystal uranium dioxide nuclear fuel pellets, comprising: granulating and pelleting $UO_2$ powder to obtain $UO_2$ pellets; then coating the surfaces of the $UO_2$ pellets with monocrystal growth additive micro powder to form core-shell structure particles; and activated-sintering the core-shell structure particles at a high temperature, liquefying monocrystal growth additives on the surfaces of the core-shell structure particles at a high temperature and then diffusing into the $UO_2$ pellets, dissolving the $UO_2$ in the liquid monocrystal growth additives, and recrystallizing the $UO_2$ to form the monocrystal $UO_2$ nuclear fuel pellets.

2. The preparation method of monocrystal uranium dioxide nuclear fuel pellets according to claim 1, wherein the monocrystal growth additive micro powder is any one of the follow four types of micro powder: Cr micro powder, $Cr_2O_3$ micro powder, mixed micro powder of $Al_2O_3$ and $SiO_2$, and mixed powder of $Al_2O_3$ and $Y_2O_3$.

3. The preparation method of monocrystal uranium dioxide nuclear fuel pellets according to claim 2, wherein the binder is at least one of zinc stearate and Acrawax.

4. The preparation method of monocrystal uranium dioxide nuclear fuel pellets according to claim 3, wherein the preparation method specifically comprises the following steps:

(1) pre-sintering the $UO_2$ powder by adopting a discharge plasma sintering technique or cold-pressing forming the $UO_2$ powder by adopting a powder metallurgy mold to obtain a $UO_2$ pre-formed blank with the density of 5.0 to 6.5 g/cm$^3$;

(2) breaking and sieving the pre-formed blank to obtain $UO_2$ particles with a particle size of 15 to 100 meshes; then grinding and pelleting the $UO_2$ particles for 2 to 12 hours to obtain $UO_2$ pellets;

(3) loading the $UO_2$ pellets into a mixing and cladding device, adding 0.05 to 0.5 wt. % of binder and 5 to 30 vol. % of monocrystal growth additive, and mixing and cladding for 0.5 to 8 hours to obtain core-shell structure particles with the monocrystal growth additive uniformly covering the surface of the $UO_2$ pellet; and (4) pressing the core-shell structure particles into $UO_2$-based nuclear fuel pellet biscuits, activated-sintering the $UO_2$-based nuclear fuel pellet biscuits at a high temperature in a micro-oxidation atmosphere, and cooling to obtain the monocrystal $UO_2$ nuclear fuel pellets, wherein the sintering temperature is 1600 to 1900° C. and the heat preserving time is 1 to 8 hours.

5. The preparation method of monocrystal uranium dioxide nuclear fuel pellets according to claim 4, wherein in the step (1), the particle size of the $UO_2$ powder is 50 nm to 200 μm.

6. The preparation method of monocrystal uranium dioxide nuclear fuel pellets according to claim 5, wherein in the step (3), the particle size of the monocrystal growth additive is 20 nm to 100 μm.

7. The preparation method of monocrystal uranium dioxide nuclear fuel pellets according to claim 6, wherein in the step (4), the density of the $UO_2$-based nuclear fuel pellet biscuit is 5.6 to 6.8 g/cm³.

8. The preparation method of monocrystal uranium dioxide nuclear fuel pellets according to claim 7, wherein in the step (4), the micro-oxidation atmosphere is a mixed gas atmosphere of hydrogen and carbon dioxide or a mixed gas atmosphere of hydrogen and steam.

9. The preparation method of monocrystal uranium dioxide nuclear fuel pellets according to claim 2, wherein when the monocrystal growth additive micro powder is the mixed micro powder of $Al_2O_3$ and $SiO_2$, a mass ratio of $Al_2O_3$ to $SiO_2$ is 1:1.

10. The preparation method of monocrystal uranium dioxide nuclear fuel pellets according to claim 9, wherein when the monocrystal growth additive micro powder is the mixed micro powder of $Al_2O_3$ and $Y_2O_3$, the mass ratio of $Al_2O_3$ to $Y_2O_3$ is 1:1.

* * * * *